United States Patent
Koike-Akino et al.

(10) Patent No.: US 9,215,457 B2
(45) Date of Patent: Dec. 15, 2015

(54) METHOD AND SYSTEM FOR COMMUNICATING MULTIMEDIA USING RECONFIGURABLE RATELESS CODES AND DECODING IN-PROCESS STATUS FEEDBACK

(75) Inventors: Toshiaki Koike-Akino, Medford, MA (US); Jesper H Soerensen, Aalborg (DK); Philip Orlik, Cambridge, MA (US)

(73) Assignee: MITSUBISHI ELECTRIC RESEARCH LABORATORIES, INC., Cambridge, MA (US)

( * ) Notice: Subject to any disclaimer, the term of this patent is extended or adjusted under 35 U.S.C. 154(b) by 674 days.

(21) Appl. No.: 13/475,350

(22) Filed: May 18, 2012

(65) Prior Publication Data

US 2013/0308700 A1    Nov. 21, 2013

(51) Int. Cl.
*H04N 7/26* (2006.01)
*H04N 19/164* (2014.01)
*H03M 13/37* (2006.01)

(52) U.S. Cl.
CPC ....... *H04N 19/00236* (2013.01); *H03M 13/373* (2013.01); *H03M 13/3761* (2013.01)

(58) Field of Classification Search
CPC .......... H03M 13/373; H03M 13/3761; H03M 13/6306; H04L 1/0057; H04L 1/0045; H04L 1/1819; H04L 1/0041; H04L 1/005; H04N 19/00236; H04N 21/2383
USPC ............... 375/240.07, 295, 219, 240.27, 262, 375/316, 240.24; 714/748, 774, 751, 758
See application file for complete search history.

(56) References Cited

U.S. PATENT DOCUMENTS

| | | | | |
|---|---|---|---|---|
| 4,355,279 | A * | 10/1982 | Younge ..................... | 324/161 |
| 6,879,561 | B1 * | 4/2005 | Zhang et al. .............. | 370/235 |
| 8,185,797 | B2 * | 5/2012 | Jun et al. .................. | 714/758 |
| 8,265,171 | B2 * | 9/2012 | Steinbach et al. ....... | 375/240.27 |
| 8,315,569 | B2 * | 11/2012 | Harada et al. ........... | 455/62 |
| 8,539,299 | B2 * | 9/2013 | Yue et al. ................. | 714/751 |
| 8,588,112 | B2 * | 11/2013 | Uppal et al. ............. | 370/277 |
| 8,677,227 | B2 * | 3/2014 | Gross et al. ............. | 714/807 |
| 8,737,519 | B2 * | 5/2014 | Jeong et al. ............. | 375/295 |
| 2008/0008231 | A1 * | 1/2008 | Wang et al. ............. | 375/219 |
| 2009/0304117 | A1 * | 12/2009 | Koslov et al. ........... | 375/340 |
| 2010/0067614 | A1 * | 3/2010 | Koslov et al. ........... | 375/295 |

OTHER PUBLICATIONS

M. Luby, "LT Codes," in Proceedings. The 43rd Annual IEEE Symposium on Foundations of Computer Science., pp. 271-280, Nov. 2002.
A. Shokrollahi, "Raptor codes," IEEE Transactions on Information Theory., pp. 2551-2567, 2006.

(Continued)

*Primary Examiner* — Phung M Chung
(74) *Attorney, Agent, or Firm* — Dirk Brinkman; Gene Vinokur (57) ABSTRACT

A method and system use capacity-approaching rateless code to communicate multimedia data even with very short codewords, such as 64 bits or less, via erasure and noise channels. The method provides a way to design the edge degree distribution of rateless codes for any arbitrary channel. Based on an equivalent metric of decoding behavior in any channels, the degree distribution of a rateless code such as Luby-transform codes and raptor codes is optimized based on in-process status of decoding. A regularized least-squares optimization is used to avoid erroneous decoding. Multiple feedbacks can further improve the performance.

17 Claims, 8 Drawing Sheets

(56) References Cited

OTHER PUBLICATIONS

A. Beimel, S. Dolev and N. Singer, "RT oblivious erasure correcting," IEEE/ACM Transactions on Networking., pp. 1321-1332, 2007.

S. Kokalj-Filipovic, P. Spasojevic, E. Soljanin and R. Yates, "ARQ with Doped Fountain Decoding," in ISSSTA '08. IEEE 10th International Symposium on Spread Spectrum Techniques and Applications, 2008., pp. 780-784, 2008.

O. Etesami and A. Shokrollahi, "Raptor codes on binary memoryless symmetric channels," IEEE Transactions on Information Theory, vol. 52, pp. 2033-2051, May 2006.

Z. Cheng, J. Castura, and Y. Mao, "On the design of Raptor codes for binary-input Gaussian channels," IEEE Transactions on Communications, vol. 57, pp. 3269-3277, Nov. 2009.

I. Hussain, M. Xiao, and L. Rasmussen, "LT coded MSK over AWGN channels," in the 6th International Symposium on Turbo Codes and Iterative Information Processing (ISTC), pp. 289-293, Sep. 2010.

P. Pakzad and A. Shokrollahi, "Design principles for Raptor codes," in IEEE ITW '06 Punta del Este., pp. 165-169, Mar. 2006.

R. Palanki and J. Yedidia, "Rateless codes on noisy channels," www.merl.com/papers/TR2003-124/, 2004.

* cited by examiner

METHOD AND SYSTEM FOR COMMUNICATING MULTIMEDIA USING RECONFIGURABLE RATELESS CODES AND DECODING IN-PROCESS STATUS FEEDBACK

FIELD OF THE INVENTION

This invention relates generally to digital communications, and more particularly to communicating multimedia using rateless codes and feedback.

BACKGROUND OF THE INVENTION

Realizing reliable communications is an important problem in packet-based communication networks using packet erasure channels, where packets are either received and decoded, or lost. This channel model is related to a binary erasure channel (BEC). If a feedback channel is available, the channel capacity can be achieved with an automatic repeat-request (ARQ). The receiver feeds back an acknowledgment for each decoded packet, and unacknowledged packets are retransmitted. Because ARQ uses frequent feedback, ARQ is difficult to implement in many practical networks, and increases overhead.

Rateless coding can achieve reliable communications on erasure channels without frequent feedback. Practical rateless codes include fountain, raptor, tornado, and Luby-transformation (LT) codes. Rateless codes can approach the channel capacity in erasure channels if the code length is sufficiently long. The rateless codes generate a potentially infinite number of encoded symbols from input symbols to approach the channel capacity. Transmission of the encoded symbols is terminated when all symbols have been correctly decoded.

Figure 1:
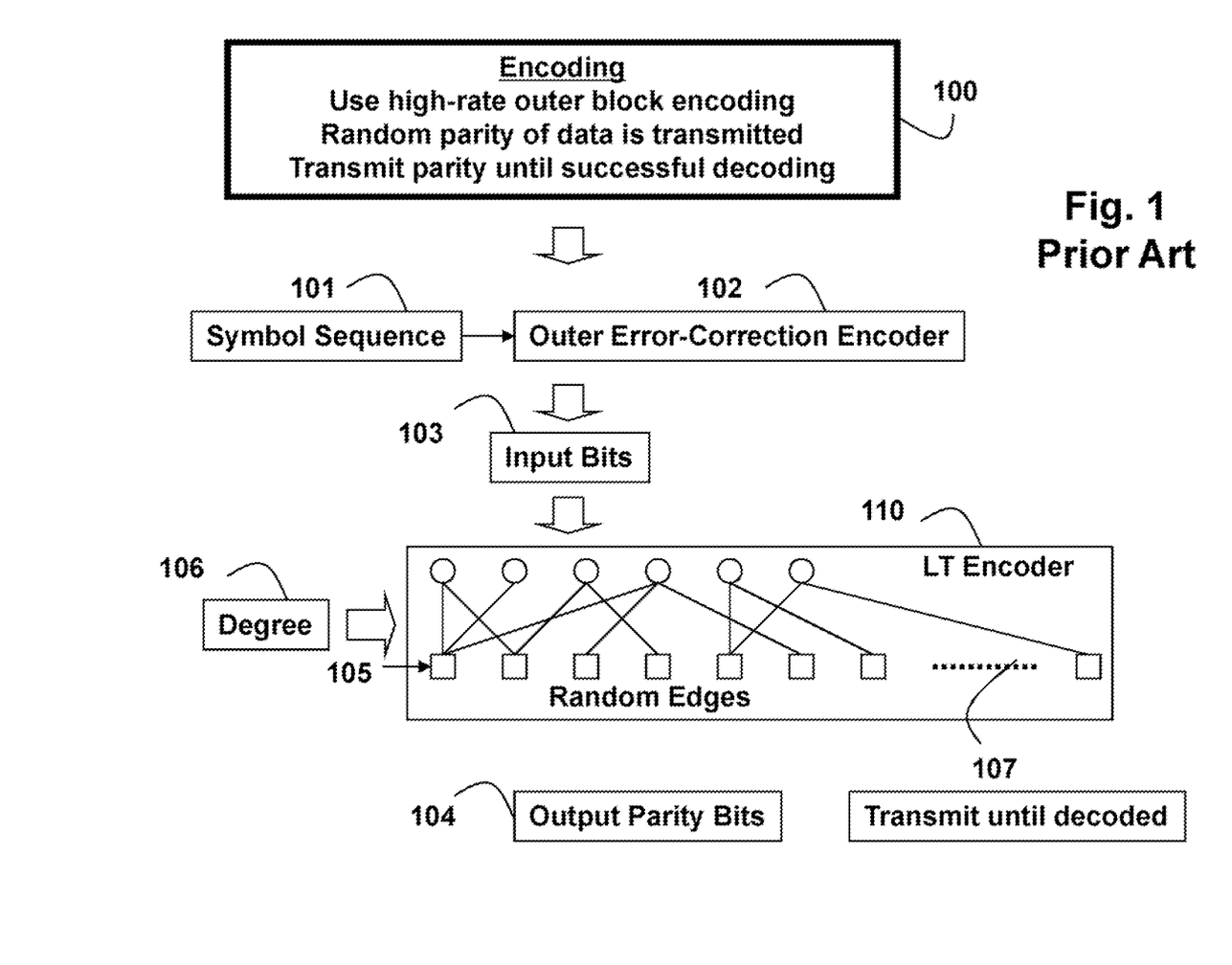
FIG. 1 is a schematic of conventional encoding with rateless codes.

FIG. 1 shows conventional rateless encoding 100 at a transmitter. Generally, the encoding uses high-rate outer block encoding. Random parity of the data is transmitted until the encoded parity is successfully decoded.

A sequence of symbols (codeword) 101 is encoded by an outer block error correction encoder 102, such as low-density parity-check (LDPC) codes. The encoded bits 103, referred to as input symbols, are fed to, e.g., the LT encoder 110. The encoder is shown as a Tanner graph.

The input symbols are combined by an exclusive-or (XOR) operation to produce the encoded output symbols. Each output symbol is the XOR'ed parity bit by combining the random input symbols. The number of edges 105 from the input symbols used in the XOR is referred to as a degree 106 of the output symbol, and all input symbols contained in an output symbol are called neighbors of the output symbol. The edges are selected at random according to the degree distribution. This process can be iterated to transmit 107 until the input symbols are decoded from the received output symbols.

Figure 2:
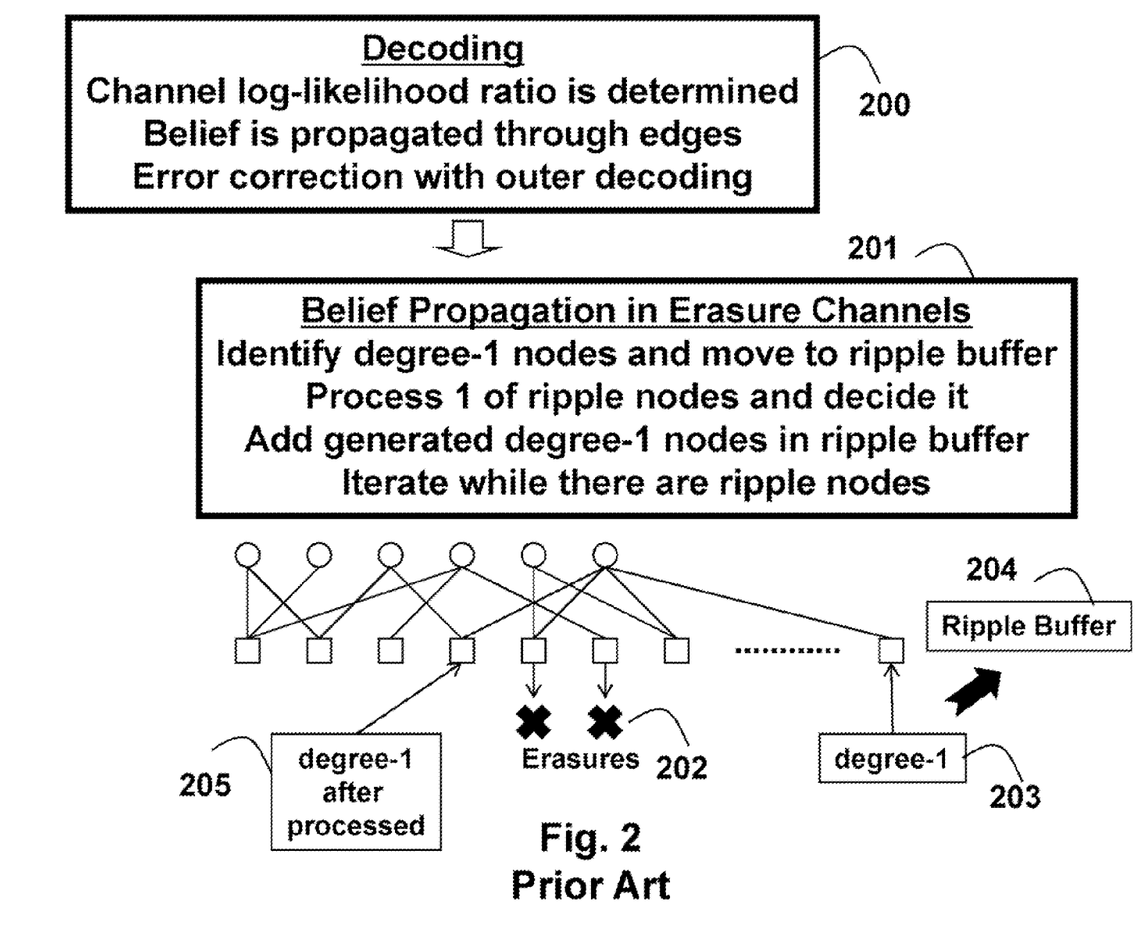
FIG. 2 is a schematic of conventional decoding with rateless codes.

FIG. 2 shows a conventional decoder 200 for a receiver of rateless codes that uses belief propagation (BP). A general decoding process of rateless codes includes determining the likelihood of reception, propagating belief information via edges, and correcting errors by outer error correction decoding. The BP decoding 201 is simple for erasure channels if every symbol is error-free and can be decoded.

All degree-1 output symbols 203 are identified and moved to a storage referred to as a ripple 204. The ripple has an associated size. Degree-1 output symbols are symbols that have a single neighbor input symbol. Symbols in the ripple are processed by the XOR operation of the ripple node to the neighbors. After a symbol has been processed 205, the symbol is removed from the ripple and considered decoded. The processing of symbols in the ripple potentially reduces some of the buffered symbols to degree one, in which case they are moved to the ripple. This is called a symbol released.

The iterative decoding process 201 can be summarized as follows. Identify all degree-one symbols and add the symbols to the ripple. Process a symbol from the ripple, and then remove the symbol. After processing, add new degree-1 symbols to the ripple. This iteration continues while there still is a symbol in the ripple. Decoding succeeds when all input symbols are decoded. If the ripple size becomes zero before processing all input symbols, decoding has failed.

To design rateless codes, the ripple size parameter is an important factor in erasure channels. The performance depends significantly on how this parameter evolves during decoding, and thus conventional methods for rateless coding have mostly focused on the size of the ripple by determining a suitable ripple evolution and a degree distribution, which achieves that desired ripple size evolution.

One ideal ripple evolutions uses only one symbol in the ripple over all decoding processes. This ideal ripple provides the so-called ideal soliton distribution (ISD) for edge degree distribution. Although ISD is optimal for infinite code lengths, ISD is suboptimal in practice with finite code lengths because decoding failure frequently occurs. One of modifications is to consider a margin of ripple size to avoid decoding failure. This idea provides a robust soliton distribution (RSD).

Another modification is based on a random walk model, which yields a square-root ripple evolution. Although rateless codes were originally developed for erasure channels, rateless codes can also be used for additive white Gaussian noise (AWGN) channels.

Channel feedback facilitates the coding, i.e., encoding and decoding. Real-time oblivious erasure correction can utilize the feedback to signal the number of input symbols that have been decoded. With this information, the transmitter selects a fixed degree for future encoded symbols, which maximizes the probability of decoding new input symbols.

In conventional doped fountain coding, the receiver feeds back information on undecoded symbols. By sending undecoded symbols with higher priority, that method improves the coding efficiency.

However, the decoding reliability and coding efficiency are suboptimal for a short codeword with rateless coding. Those design techniques are not compatible in practical feedback systems to obtain some feedback from the decoder in noisy channel environments.

SUMMARY OF THE INVENTION

The embodiments of the invention provide a method for reliable multimedia communications with feedback, wherein the communications are from a transmitter to a receiver. The feedback provides information to the transmitter while data are transmitted, received and decoded. For example, the feedback includes in-process status of a rateless decoder at the receiver.

The method uses capacity-approaching rateless codes, even with very short codewords, e.g. 64 bits or less, while the conventional capacity approaching codes based on low-density parity-check (LDPC) require more than 10,000 bits. The method offers a way to design relates codes in any arbitrary channel including additive white Gaussian noise (AWGN) channels, and a binary symmetric channel (BSC), as well as a binary erasure channel (BEC).

The embodiments are a generalized design method stemming from the erasure channel. Based on an equivalent metric of decoding behavior in any channels, the degree distribution of the rateless code can be optimized dynamically.

A regularized least-squares optimization is used to avoid erroneous decoding. One embodiment of the invention enables multiple feedback opportunities to further improve the performance.

DETAILED DESCRIPTION OF THE PREFERRED EMBODIMENTS

The embodiments of the invention provide a method for reliable multimedia communications with feedback, wherein the data are communicated from a transmitter to a receiver. The receiver feeds back information regarding the decoding process to the transmitter, so that the transmitter can optimize a degree distribution used by an encoder. The degree distribution is time-varying. The feedback is generated as the decoding progresses. The feedback includes in-process status of the rateless decoder at the receiver.

The rateless codes use feedback when it is available. For simplicity, we focus on a single feedback. However, the concept of our rateless coding incorporating feedback can be generalized to any amount of feedback for erasure or noisy channel environments.

Figure 3:
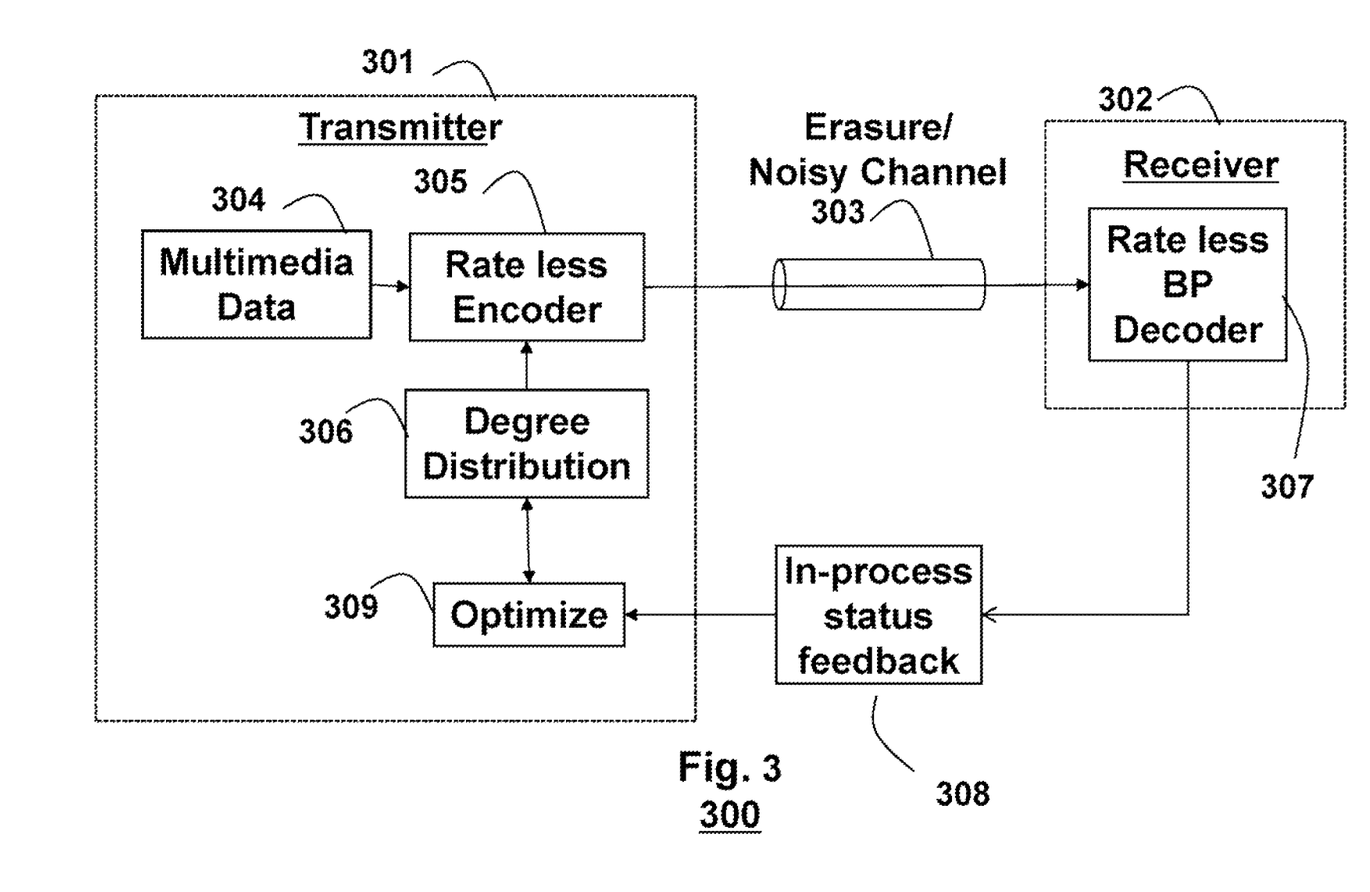
FIG. 3 is a schematic of reconfigurable rateless coding incorporating informative feedback according to embodiments of the invention.

FIG. 3 shows a communication network 300, which uses reconfigurable rateless coding with feedback 308 according to embodiments of the invention.

A transmitter 301 communicates with a receiver 302 via a channel 303, which can be subject to erasures and/or noise. Multimedia data 304 are transmitted using a rateless encoder 305, which uses a degree distribution 306. For example, the encoder 305 is an LT encoder.

The receiver 302 decodes the channel output signals using a belief propagation (BP) rateless decoder 307. The invention provides a way to optimize 309 the reliability and efficiency of the rateless codes by using the feedback 308, which contains in-process status of the rateless BP decoder 307.

Using the feedback, the transmitter optimizes 309 the degree distribution 306 for the rateless codes to improve the decoding efficiency.

With the erasure channel 303, the feedback 308 signals the transmitter which input symbols have been decoded at an optimal feedback timing. Hence, the transmitter knows exactly the symbols that have been decoded.

This enables the rateless LT encoder 305 to adapt the degree distribution 306 dynamically. The encoder 305 excludes all decoded symbols from future encoding to reduce overhead, and modifies the degree distribution to ensure that the ripple size at the decoder does rapidly decrease to zero without a decoding failure.

The determining of the ripple evolutions includes both the ISD and RSD. An improved ripple evolution is based on a random walk model, which provides a square-root ripple evolution.

Figure 4:
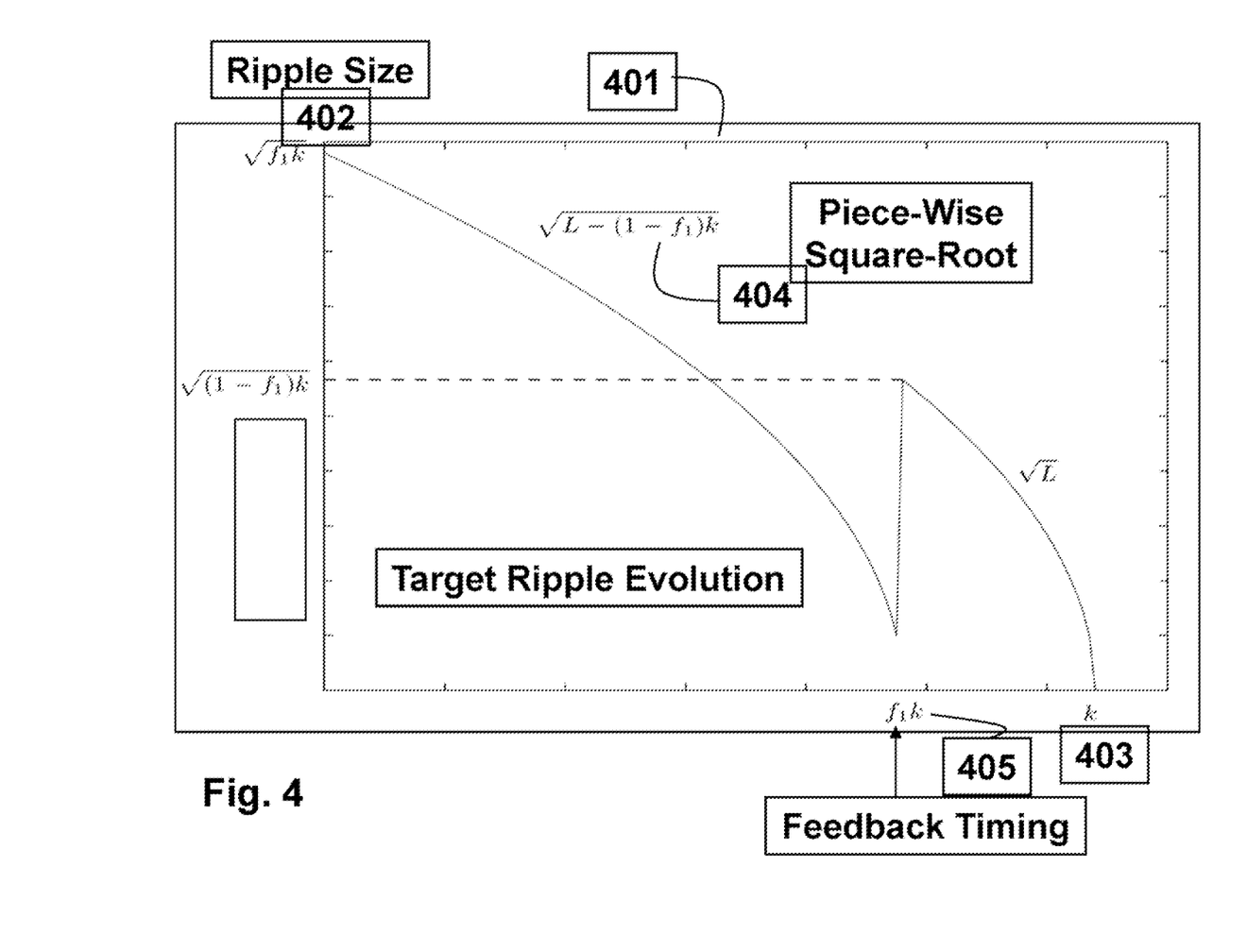
FIG. 4 is a graph of ripple size to evolve in a decoding process with feedback information according to embodiments of the invention.

As shown in FIG. 4, when there are feedback opportunities, the square-root ripple evolution is modified to a piece-wise square-root evolution. This figure shows a determining ripple size evolution 401 over a decoding process. A message (codeword) length is k bits, and a number of decoded bits in process is L.

One design principle is to have a large enough margin for avoiding decoding failures, yet small enough to avoid redundancy to decode all bits. Hence, the initial ripple size 402 is large enough, e.g. 10, while the last ripple 403 is zero. The ripple curve is defined as a piece-wise square-root function 404 over the decoding process as:

$$R(L)=c_1\sqrt{L-(1-f_1)k} \text{ for } L>(1-f_1)k$$

$$R(L)=c_i\sqrt{L-(1-f_i)k} \text{ for } (1-f_{i-1})k>L>(1-f_i)k,$$

where $R(L)$ is the ripple size, $f_i$ is a fraction of the decoding process at the i-th feedback timing, and $c_i$ is an appropriate constant. At the feedback timing 405, where $f_1k$ symbols are decoded, the ripple size is near zero, i.e., 1.

Figure 5:
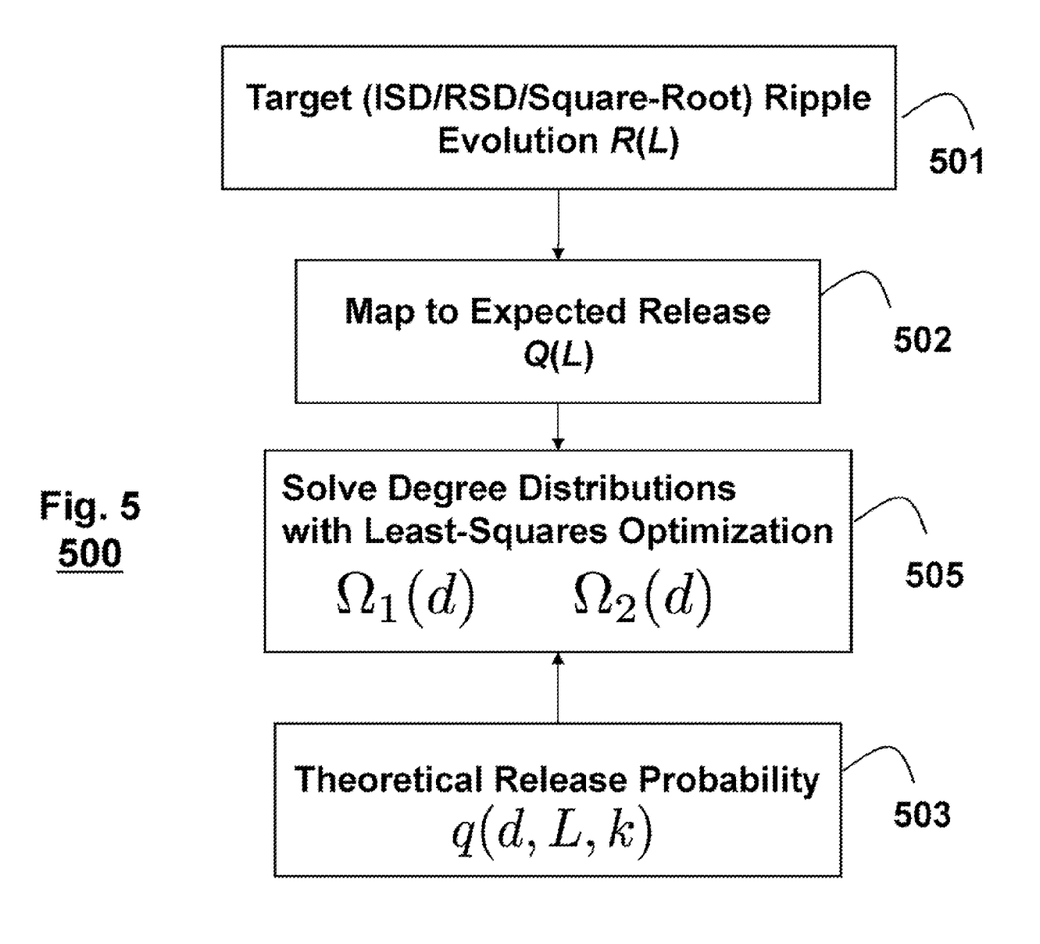
FIG. 5 is a block diagram of designing degree distribution to achieve the ripple evolution by using a least-squares optimization according to embodiments of the invention.

FIG. 5 shows our method 500 for designing the degree distribution to achieve the determining ripple evolution for any code lengths. Two different degree distributions are determined, for a single feedback, one before the feedback, and the other after the feedback.

The determining ripple size evolution $R(L)$ 501 is mapped 502 to $Q(L)$, which denotes an expected number of releases at the decoding step. The mapping is expressed as $$Q(L) = \frac{L(R(L) - R(L+1)+1)}{L-(R(L+1)-1)} \text{ for } k > L \geq 0$$

where $Q(k)=R(k)$.

The expected number of releases $Q(L)$ is expressed by a theoretical release probability $q(d, L, k)$ 503 of the degree d $$q(d, L) = \frac{d(d-1)L\prod_{j=0}^{d-3}(k-(L+1)-j)}{\prod_{j=0}^{d-1}(k-j)}$$

as $$Q(L) = \sum_{d=1}^{k-L+1} n\Omega(d)q(d, L, k),$$

where n is the number of received symbols and $\Omega(d)$ is the degree distribution. That is, $\Omega(d)$ represents a probability that an output symbol has degree d, (d=1, 2, 3, . . . ). For the case of single feedback, the method solves 505 the optimal degree distributions, i.e., $\Omega_1(d)$ before feedback, and $\Omega_2(d)$ after feedback. Because the above equation is numerically unstable to solve, the invention uses a least-squares optimization to obtain near optimal degree distributions.

Figure 6:
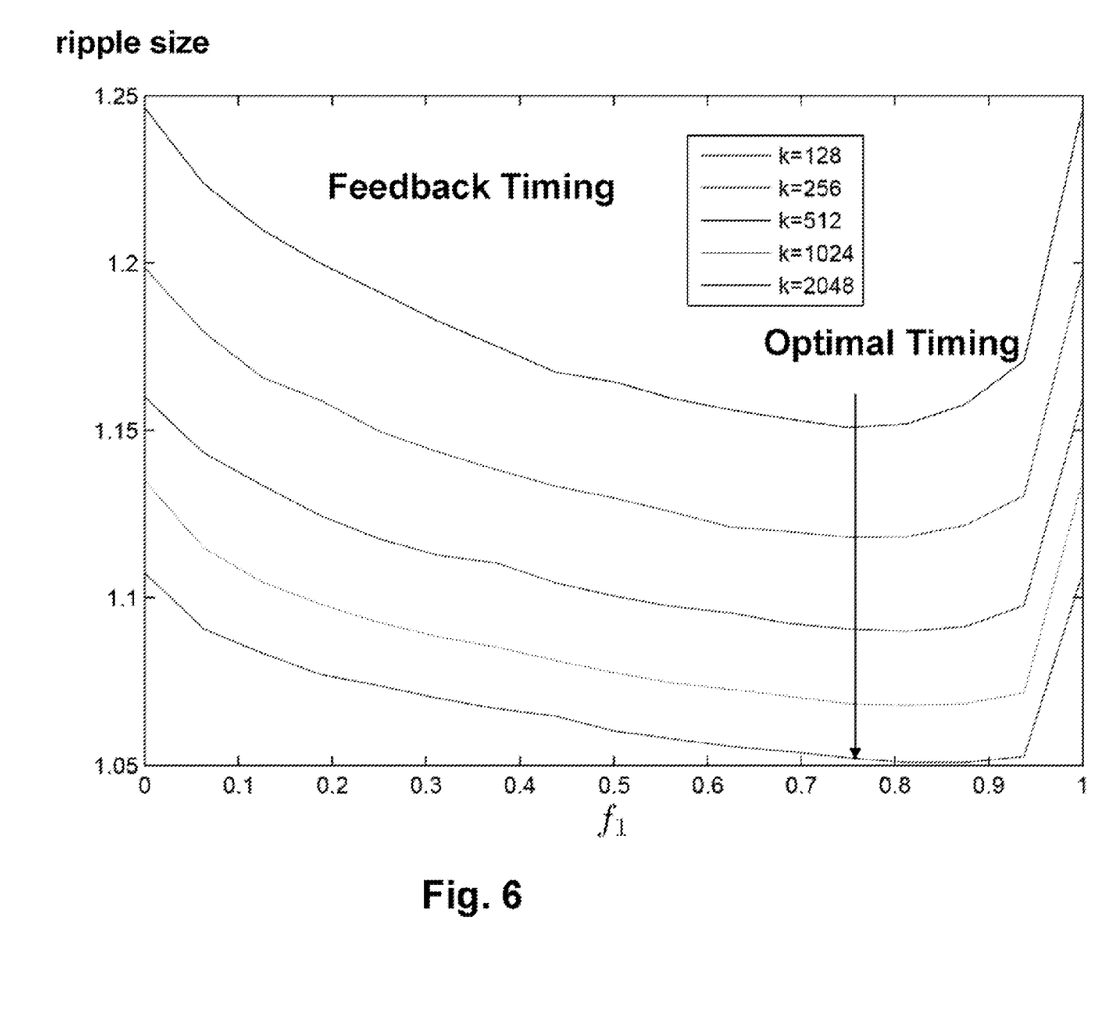
FIG. 6 is graph of the impact of feedback timing according to embodiments of the invention.

FIG. 6 shows the efficiency in the sense of overhead of the LT coding with single feedback as a function of the feedback timing $f_1$. The optimal feedback timing is about $f_1=0.75$ for piece-wise square-root ripple evolutions. The curves, from top to bottom are for k=128, 256, 512, 1024, and 2048. The graph shows that shorter codes need more overheads, and the method using feedback can significantly reduces the overhead.

The design method, which uses the least-squares optimization and piece-wise square-root ripple evolution, can be extended to the case of multiple intermediate feedback opportunities. The number of feedback opportunities can be a network parameter. The least-squares solution achieves optimal determining ripple evolutions.

Figure 7:
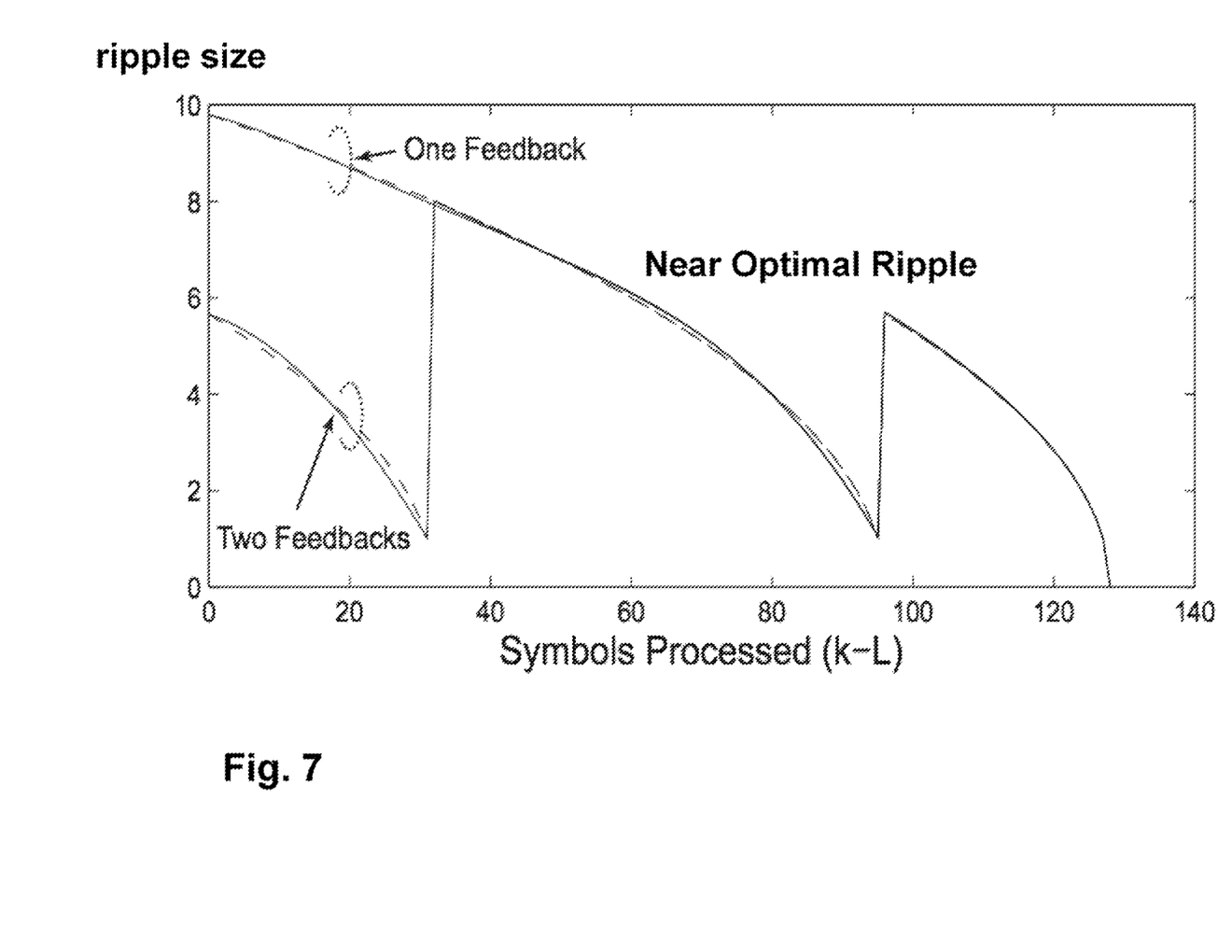
FIG. 7 is a graph ripple evolutions via least-squares optimization for single and double feedback opportunities according to embodiments of the invention.

FIG. 7 shows an example of achieved near optimal ripple evolutions to approach the determining piece-wise square-root ripple for the similar cases of single and double feedback cases.

The conventional RSD has a considerably large overhead, while our LT coding with feedback can significantly improve the efficiency of the coding. The invention also decreases the encoding/decoding complexity because the average degree is decreased.

The rateless raptor coding structure, which uses an outer error-correction code, can further reduce the coding (encoding/decoding) complexity.

xxThe invention can be applied to the raptor coding by adding a constraint of the average degree into the least-squares optimization. The average degree is expressed as $$\bar{d} = \sum_{i=1}^{m+1} \frac{n_i}{n} \sum_{d=1}^{k'_{i-1}-k'_i} d\Omega_i(d)$$

$$n = \sum_{i=1}^{m+1} n_i,$$

where m is the number of feedback opportunities, $k'_i=(1-f_i)k$ with $f_i$ is the i-th feedback timing, $n_i$ is the received symbol at the i-th feedback. This equation is added to the least squares optimization with a relatively large constraint weighting.

The ripple size is near zero at the feedback timing for piece-wise square-root evolutions. If it becomes exactly zero, then the decoding has failed. To avoid such a decoding failure, a constraint is added to the least-squares optimization so that the sufficient amount of releases is achieved prior to the feedback. And, the feedback is performed when the actual ripple size becomes 1 to avoid decoding failure.

For raptor coding of k=128 bits with single feedback, the average degree is reduced to be half of the comparable LT code, and hence, the complexity is half.

Figure 8:
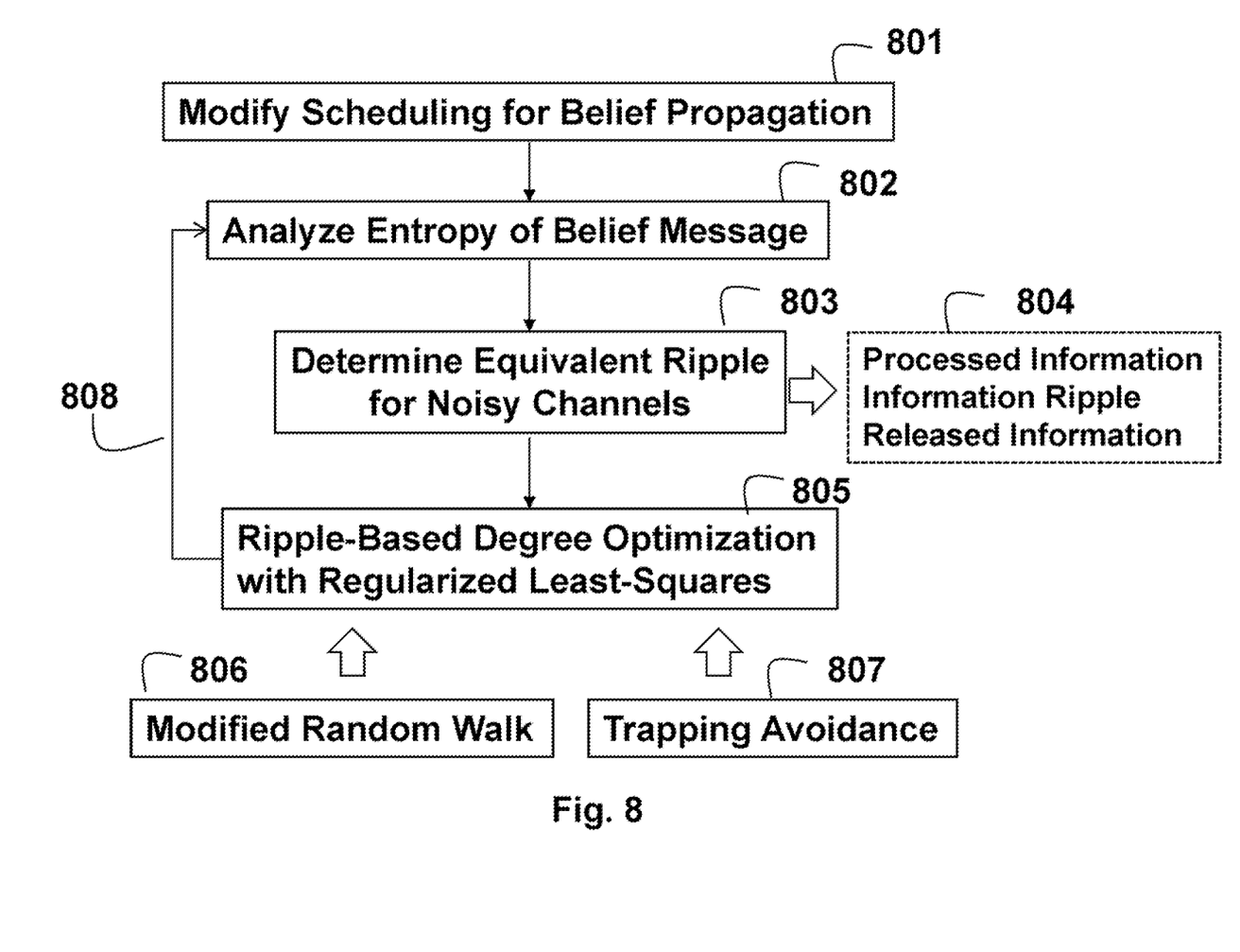
FIG. 8 is a block diagram of a method for designing the degree distribution based on ripple evolution in noisy channels according to embodiments of the invention.

FIG. 8 shows an embodiment of the invention for degree optimization in noisy channels, instead of erasure channels based on ripple analysis. For noisy channels, the BP decoding becomes more complicated because the channel output is not perfectly reliable. While the conventional BP decoding uses a batch scheduling, in which a belief message is simultaneously propagated, it is known that sequential scheduling such as random propagation performs better.

The feedback information for noisy channels includes belief messages. The belief propagation messages indicate the reliability of the decoding of each symbol. Using this information, the transmitter optimizes the degree distribution and priority weighting according to the reliability.

The embodiment first analyzes the entropy of the belief messages 802, for such a modified scheduling 801. Based on the entropy, the invention provides a way of equivalently interpreting the noisy channels into the erasure channels by determining 803 the information-theoretic mutual information 804, which defines an equivalent ripple. The mutual information is then used to optimize the degree distribution using the least-squares optimization 805.

For noisy channels, the optimal degree distribution depends on the error probability or the noise variance. To deal with the impact of the noise variance, the embodiment of the invention uses a modified random walk model 806 to optimize the determining ripple. Because the belief message may contain erroneous information, the least-squares optimization is also modified to improve the performance by adding a regulation term to avoid trapping 807 during erroneous belief propagation 807. With updated degree distribution, the optimization process from the entropy analysis 802 to the degree design 805 iterates 808 until convergence.

A conventional random walk model assumes increment or decrement at random for one symbol decoding process. For noisy channels, the processed symbol is not always one symbol. The embodiment uses a high-order polynomial to model the transient movement. For most cases, the first-order polynomial has a sufficiently good performance. With this modified random walk model, the determining ripple evolution is expressed by a bended square-root function.

For noisy channels, the BP decoding can be trapped by an even number of erroneous belief messages in neighbors. Such a trapping can be avoided by maximizing the probability of an even number of error bits compared to the probability of an odd number of error bits. The regularized least-squares optimization maximizes this probability subject to squared error of the ripple equation.

Another embodiment of the invention, the outer block error-correcting code is at a relatively high rate, i.e., greater than 0.95, and includes nonlinear block coding linear block coding so that layered multimedia data have unequal error protection for layered multimedia data by using nonlinear block error correction codes, rather than linear block coding. A random edge selection is modified by considering priority information, which is obtained from the feedback.

While the degree distribution can be designed off-line, an informative feedback can reconfigure the degree distribution and priority weighting dynamically in real-time-line.

The embodiments provide a way to reconfigure those parameters by Monte-Carlo simulation of an expected performance before transmitting. After Monte-Carlo simulations, the optimal performing degree distribution is selected.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:
1. A method communicating multimedia data from a transmitter to a receiver, comprising the steps:
encoding, in the transmitter, the multimedia data by a rateless encoder to produce encoded data using a degree distribution;
transmitting the encoded data to the receiver via a channel, wherein the channel is subject to noise;

decoding, in the receiver, an output of the channel by a decoder, wherein the decoder is a rateless decoder, and wherein the decoder is a random belief propagation decoder;

transmitting, from the receiver to the transmitter, feedback of an in-process decoding status of the decoder at the receiver at an optimal feedback timing while receiving the encoded data;

updating, in the transmitter, the degree distribution based on the feedback, such that the degree distribution varies over time;

determining belief messages based on the decoder given the degree distribution;

analyzing an entropy of the belief messages to determine an equivalent ripple size;

optimizing the degree distribution having the equivalent ripple size using a regularized least-squares optimization; and iterating the steps of the determining the belief messages, analyzing the entropy and the optimizing until the degree distribution convergences to an optimal degree distribution.

2. The method of claim of 1, wherein the updating comprise:

determining a first degree distribution before receiving the feedback;

determining a second degree distribution after receiving the feedback, wherein the first and the second degree distributions are determined using a least-squares optimization; and updating the degree distribution with the first or the second degree distributions increasing a theoretical release probability.

3. The method of claim of 1, wherein the equivalent ripple size is designed by a modified random walk model, and wherein the modified random walk model uses a high-order polynomial movement, resulting into a piece-wise square-root ripple for an erasure channel, and a bended square-root ripple for the channel.

4. The method of claim of 1, wherein the encoded data includes input symbols and output symbol, and further comprising:

performing trapping avoidance by determining a failure probability of an even number of error messages, and a successful probability of an odd number of error messages contained in neighbors, wherein all input symbols contained in a particular output symbol are the neighbors of the output symbol.

5. The method of claim of 1, wherein optimal feedback timing for multiple feedbacks is optimized by evaluating an expected overhead.

6. The method of claim of 1, wherein the feedback is done when an actual ripple size becomes 1 and an expected release is added in a constraint term of a least-squares optimization to avoid decoding failure at those timing.

7. The method of claim of 1, further comprising:

modifying the rateless encoder selecting random to a non-uniform random edge selection to consider priority information in the feedback.

8. The method of claim of 1, further comprising:

selecting a number of feedback opportunities as a network parameter.

9. The method of claim of 1, wherein the degree distribution is optimized off-line.

10. The method of claim of 1, wherein the degree distribution is optimized on-line using Monte-Carlo simulations.

11. The method of claim 1, wherein the feedback includes belief propagation messages of in-process decoding at the receiver.

12. The method of claim 1, wherein the optimal feedback timing is determined when a ripple size of the decoder is 1.

13. The method of claim 12, wherein the decoding reduces the size of the ripple according to a piece-wise square-root function.

14. The method of claim 12, wherein an initial size of the ripple is 10.

15. The method of claim 1, further comprising:

determining optimal feedback timing as a fraction of time of the decoding.

16. The method of claim 1, wherein the decoder is a rateless belief propagation decoder.

17. A network for communicating multimedia data with informative feedback, comprising:

a transmitter configured to encode the multimedia data by a rateless encoder to produce encoded data according to a degree distribution; and a receiver configured to decode the encoded data received via a channel from the transmitter using a decoder, wherein the receiver feeds back a decoding status at an optimal feedback timing while receiving the encoded data to enable the transmitter to update the degree distribution based on the feedback, wherein the decoder is a random belief propagation decoder configured for determining belief messages based on the decoder given the degree distribution, analyzing an entropy of the belief messages to determine an equivalent ripple size, optimizing the degree distribution having the equivalent ripple size using a regularized least-squares optimization, and iterating the steps of the determining the belief messages, analyzing the entropy and the optimizing until the degree distribution convergences to an optimal degree distribution.

* * * * *